United States Patent
Willigan et al.

(10) Patent No.: US 9,806,125 B2
(45) Date of Patent: Oct. 31, 2017

(54) COMPOSITIONALLY GRADED PHOTODETECTORS

(71) Applicant: Carrier Corporation, Farmington, CT (US)

(72) Inventors: Rhonda R. Willigan, Manchester, CT (US); Jose L. Santana, Vernon, CT (US); Marcin Piech, East Hampton, CT (US)

(73) Assignee: Carrier Corporation, Farmington, CT (US)

( * ) Notice: Subject to any disclaimer, the term of this patent is extended or adjusted under 35 U.S.C. 154(b) by 0 days.

(21) Appl. No.: 15/215,085

(22) Filed: Jul. 20, 2016

(65) Prior Publication Data

US 2017/0033150 A1 Feb. 2, 2017

Related U.S. Application Data

(60) Provisional application No. 62/198,033, filed on Jul. 28, 2015.

(51) Int. Cl.
*H01L 27/146* (2006.01)
*H01L 31/0296* (2006.01)
(Continued)

(52) U.S. Cl.
CPC .... *H01L 27/14685* (2013.01); *H01L 21/0251* (2013.01); *H01L 21/02472* (2013.01); *H01L 21/02483* (2013.01); *H01L 21/02505* (2013.01); *H01L 21/02554* (2013.01); *H01L 21/02565* (2013.01); *H01L 21/02628* (2013.01); *H01L 27/1462* (2013.01); *H01L 27/14636* (2013.01); *H01L 31/02966* (2013.01); *H01L 31/09* (2013.01); *H01L 31/1832* (2013.01)

(58) Field of Classification Search
CPC .............................. H01L 31/09; H01L 31/101
See application file for complete search history.

(56) References Cited

U.S. PATENT DOCUMENTS

| 4,090,177 A | 5/1978 | Urata et al. |
| 5,339,070 A | 8/1994 | Yalowitz et al. |

(Continued)

FOREIGN PATENT DOCUMENTS

| CN | 1400674 A | 3/2003 |
| CN | 100358159 C | 12/2007 |

(Continued)

OTHER PUBLICATIONS

Machine translation (retrieved Mar. 2, 2017) of JP2013004674, published Jan. 7, 2013.*

(Continued)

*Primary Examiner* — Tucker J Wright
(74) *Attorney, Agent, or Firm* — Locke Lord LLP; Scott D. Wofsy; Christopher J. Cillié

(57) ABSTRACT

An ultraviolet photodetector for a sensor device includes a film deposited on a substrate. The film includes a compositionally graded magnesium-zinc oxide having a ratio of magnesium-to-zinc that decreases between a portion of the film adjacent to the substrate and a portion of the film opposite the substrate for shifting the peak absorption of the film toward the visible wavelengths of the electromagnetic spectrum.

22 Claims, 4 Drawing Sheets

(51) Int. Cl.
*H01L 31/09* (2006.01)
*H01L 31/18* (2006.01)
*H01L 21/02* (2006.01)

(56) References Cited

U.S. PATENT DOCUMENTS

| | | | |
|---|---|---|---|
| 5,494,700 | A | 2/1996 | Anderson et al. |
| 5,699,035 | A | 12/1997 | Ito et al. |
| 5,830,412 | A | 11/1998 | Kimura et al. |
| 6,166,647 | A | 12/2000 | Wong |
| 6,239,435 | B1 | 5/2001 | Castleman |
| 6,255,651 | B1 | 7/2001 | Laluvein et al. |
| 6,358,378 | B2 | 3/2002 | Choi et al. |
| 6,518,077 | B2 | 2/2003 | Narayan et al. |
| 6,621,192 | B2 | 9/2003 | Lu et al. |
| 6,846,731 | B2 | 1/2005 | Lu et al. |
| 7,132,668 | B2 | 11/2006 | Vispute et al. |
| 7,172,813 | B2 | 2/2007 | Burgener, II et al. |
| 7,202,794 | B2 | 4/2007 | Huseynov et al. |
| 7,333,910 | B2 | 2/2008 | Ishii |
| 7,432,024 | B2 | 10/2008 | Talin et al. |
| 7,541,938 | B1 | 6/2009 | Engelhaupt |
| 7,566,875 | B2 | 7/2009 | Starikov et al. |
| 7,767,253 | B2 | 8/2010 | Sharma |
| 8,536,618 | B2 | 9/2013 | Richardson et al. |
| 8,878,157 | B2 | 11/2014 | Wu et al. |
| 8,926,317 | B2 | 1/2015 | Farrell et al. |
| 2006/0183249 | A1 | 8/2006 | Yao et al. |
| 2008/0036593 | A1 | 2/2008 | Rose-Pehrsson et al. |
| 2010/0276003 | A1 | 11/2010 | Kawano et al. |
| 2011/0259080 | A1 | 10/2011 | Ratcliffe et al. |
| 2012/0001760 | A1 | 1/2012 | Harchanko |
| 2013/0092933 | A1 | 4/2013 | Nakamura |
| 2013/0341619 | A1 | 12/2013 | Nakamura |
| 2014/0284598 | A1 | 9/2014 | Boutwell et al. |
| 2014/0287147 | A1 | 9/2014 | Bartl et al. |
| 2014/0319317 | A1 | 10/2014 | Lai et al. |
| 2015/0022592 | A1 | 1/2015 | Aoyama et al. |
| 2015/0171257 | A1 | 6/2015 | Maekawa et al. |

FOREIGN PATENT DOCUMENTS

| | | |
|---|---|---|
| CN | 101210313 A | 7/2008 |
| CN | 101285147 A | 10/2008 |
| CN | 101285173 A | 10/2008 |
| CN | 101286535 A | 10/2008 |
| CN | 100561742 C | 11/2009 |
| CN | 101807619 A | 8/2010 |
| CN | 101866983 A | 10/2010 |
| CN | 101935876 A | 1/2011 |
| CN | 101969023 A | 2/2011 |
| CN | 102110735 A | 6/2011 |
| CN | 201964955 U | 9/2011 |
| CN | 102569483 A | 7/2012 |
| CN | 102694053 A | 9/2012 |
| CN | 202633358 U | 12/2012 |
| CN | 103205706 A | 7/2013 |
| CN | 103219418 A | 7/2013 |
| CN | 103258869 A | 8/2013 |
| CN | 103346171 A | 10/2013 |
| CN | 103346199 A | 10/2013 |
| CN | 103441154 A | 12/2013 |
| CN | 103441186 A | 12/2013 |
| CN | 103545397 A | 1/2014 |
| CN | 103915524 A | 7/2014 |
| CN | 103972310 A | 8/2014 |
| CN | 104504838 A | 4/2015 |
| CN | 104617180 A | 5/2015 |
| GB | 2222908 A | 3/1990 |
| JP | 2006278487 A | 10/2006 |
| JP | 2013-004674 A | 1/2013 |
| KR | 101009532 B1 | 1/2011 |
| KR | 101192934 B1 | 10/2012 |
| WO | WO-2010091703 A1 | 8/2010 |

OTHER PUBLICATIONS

<http://ieeexplore.ieee.org/xpl/article> titled *A Fire Detecting Method Based on Multi-Sensor Data Fusion* by Shaohau Chen, Hong Bao, Xianyun Zeng, Yimin Yang, Faculty of Automation, Guangdong University ofTechnology, Guangzhou, 510090, P.R. China, bhongg163.net <http://bhongg163.net>.

<http://www.tradeindia.com/fp1824652/IR-UV-Flame-Detector.html,> ESP Safety Pvt. Ltd, Description/Specification of IR/UV Flame Detector.

<https://www.google.co.in>, Open Access algorithms ISSN 1999-4893 www.mdpi.com/journal <http://www.mdpi.com/journal> algorithms, Article in Algorithms 2014, 7, 523; doi:10.3390/a7040523 titled "Multi-Sensor Building Fire Alarm System with Information Fusion Technology Based on D-S Evidence Theory" by Qian Ding, Zhenghong Peng, Tianzhen Liu and Qiaohui Tong, School of Urban Design, Wuhan University, Bayi Road 16, Wuhan 430072, Hubei, China.

Extended European Search Report dated Dec. 19, 2016, issued from European Patent Office in corresponding European Patent Application No. 16181769.7.

Suo Bai et al.: "High-Performance Integrated ZnO Nanowire UV Sensors on Rigid and Flexible Substrates", Advanced Functional Materials, Wiley—V C H Verlag Gmbh & Co. KGAA, DE, vol. 21, No. 23, Dec. 6, 2011 (Dec. 6, 2011), pp. 4464-4469, XP001571417, ISSN: 1616-301X, DOI: 10.1002/ADFM.201101319.

Abdelrahim Ate et al: "Ultrafast and High Sensitive UV/IR Photodetector Based on a Single SnO 2 Nanowire", International Journal of Optoelectronic Engineering, Jan. 1, 2014 (Jan. 1, 2014), pp. 6-10, XP055326489, 001: 10.5923/j.ijoe.20140401.02.

Yanjun Zhang et at: "High performance ultraviolet photodetectors based on an individual Zn2SnO4 single crystalline nanowire",Journal of Materials Chemistry, vol. 20, No. 44, Jan. 1, 2010 (Jan. 1, 2010), p. 9858, XP055326623,GB ISSN: 0959-9428, DOI: 10.1039/c0jm02872j.

H. Zhu et at: "Metal-Oxide-Semiconductor-Structured MgZnO Ultraviolet Photodetector with High Internal Gain", Journal of Physical Chemistry C, vol. 114, No. 15, Apr. 22, 2010 (Apr. 22, 2010), pp. 7169-7172, XP055326648, ISSN: 1932-7447, DOI: 10.1021/jp101083n.

Lee Keun et at: "Photosensitivity of solution-based indium gallium zinc oxide single-walled carbon nanotubes blend thin film transistors", Applied Physics Letters, A I P Publishing LLC, US, vol. 94, No. 10, Mar. 13, 2009 (Mar. 13, 2009), pp. 102112-102112,XP012118314, ISSN: 0003-6951, DOI: 10.1063/1.3098406.

M.M. Fan et al.: "High-performance solar-blind ultraviolet photodetector based on mixed-phase ZnMgO thin film", *Applied Physics Letters* 105, 011117 (2014).

M. Wei, et al.: "Characteristics of ZnMgO thin films prepared by the Sol-gel method," *Advanced Materials Research*, 1662-8985, vols. 60-61, pp. 110-113, Jan. 20, 2009.

M. Caglar, et al.: "MgxZn1-x0 (x=0-1) films fabricated by sol-gel spin coating," *Materials Reserach Bulleting* 45, (2010), pp. 284-287.

Extended Search Report in connection with EP16181490.0 dated Jan. 4, 2017.

Y. N. Hou, et al.: "Monolithic color-selective ultraviolet (266-315 nm) photodetector based on a wurtzite MgxZn1-x0 film," Applied Physics Letters 105, 133510 (2014).

K. Hoggas, et al.: "Structural, microstructural, and optical properties of Zn1—xMgx0 thin films grown onto glass substrate by ultrasonic spray pyrolysis," Applied Physics A (2015) 120:745-755.

Partial Search report dated Jan. 5, 2017 in connection with EP Application No. EP16181398.5.

Chu T. T. et al.,: "Characterization of UV photodetectors with Mg"xZn" 1"@?" x0 thin fims," Microelectronic Engineering, Elsevier Publishers BV., Amsterdam, NL, vol. 87, No. 9, Nov. 1, 2010, pp. 1777-1780.

(56) References Cited

OTHER PUBLICATIONS

S. S. Hullavarad et al.,: "Realization of Mg(x=0.15)Zn(1-x=0.85)O-based metal-semiconductor-metal UV detector on quartz and sapphire," J. Vac. Sci. Technol. A23(4), Jul./Aug. 2005, American Vacuum Society, pp. 982-985.

H. Zuopeng, et al.: "Fabrication and characterization of MgxNi1-x1 thin fims by sol-gel dip-coating," Chinese Journal of Semiconductors, vol. 26, Issue 4, Apr. 2005, pp. 721-725 with English abstract.

\* cited by examiner

COMPOSITIONALLY GRADED PHOTODETECTORS

CROSS-REFERENCE TO RELATED APPLICATION

This application claims the benefit of priority under 35 U.S.C. §119(e) to U.S. Provisional Application No. 62/198,033, filed Jul. 28, 2015, which is incorporated herein by reference in its entirety.

BACKGROUND OF THE INVENTION

1. Field of the Invention

The present disclosure relates to photodetectors, and more particularly to photodetectors for ultraviolet (UV) radiation such as in flame detectors.

2. Description of Related Art

The majority of deaths associated with residential fires occur in part because of missing or ineffective smoke alarms. Of these fires, some are caused by open flame sources like lighters and/or candles. Flame sensors can provide a more rapid warning of the presence of fire or flame compared to smoke alarms, potentially reducing fire-related deaths and injuries, because they detect the radiation emitted by fire and flame instead of smoke. This radiation will generally reach a flame detector more rapidly than heat or smoke from such fire or flame tends to reach a smoke detector. These flame detectors typically include a UV sensitive film that has an absorption that renders the photodetector responsive to incident UV radiation emitted by fire or flame. The films are generally fabricated using vapor deposition routes that include chemical vapor deposition (CVD), molecular beam epitaxy (MBE), or sputtering.

Such conventional films and methods used to develop such films have generally been considered satisfactory for their intended purpose. However, there is still a need in the art for improved methods of making UV photodetectors and sensors, in particular cost. Vapor deposition routes tend to be costly in terms of up front capital, usage, energy, and maintenance, while a solution based chemical deposition route, such as spin coating, can be less expensive and can enable some of the more cost sensitive residential markets to adopt said UV photodetector technology. The present disclosure provides a solution for this need.

SUMMARY OF THE INVENTION

An ultraviolet (UV) radiation photodetector includes a film deposited over a substrate and an electrode connected to the film. The film includes a compositionally graded magnesium-zinc oxide overlaying a surface of the substrate. The ratio of zinc to magnesium in the magnesium-zinc oxide forming the film increases from a portion of the film adjacent to the substrate surface to a portion of the film opposite the substrate surface for shifting the peak absorption of the film towards the visible portion of the electromagnetic spectrum.

In certain embodiments, the film can include a plurality of layers deposited on the substrate. The layers can each have layer specific zinc content, and the zinc content of a given layer can increase as the distance of the layer from the substrate increases. The layers can each have layer specific magnesium content, and the magnesium content of a given layer can decrease as the layer distance from the substrate decreases. Both magnesium content can decrease and zinc content can change as the distance layer from the substrate increases, the zinc content increasing and the magnesium content correspondingly decreasing as the layer distance from the substrate increases. It is contemplated that each of the layers can have a cubic crystalline structure.

In accordance with certain embodiments, the film can include a base layer overlaying the substrate, one or more intermediate layers overlaying the base layer, and an incident layer overlaying the one or more intermediate layers. The base layer can include a magnesium-zinc oxide composition according to $Mg_xZn_{(1-x)}O$, the one or more intermediate layers can include magnesium-zinc oxide compositions according to $Mg_yZn_{(1-y)}O$, and the incident layer can include a magnesium-zinc oxide composition according to $Mg_zZn_{(1-z)}O$. X can be greater Y and Y can be greater than Z.

It is also contemplated that, in accordance with certain embodiments, the UV photodetector can include a film with seven or more layers. Layers closer to (i.e. proximate) the substrate can have magnesium content that is greater than layers further from (i.e. distal) the substrate. Layers closer to the substrate can have zinc content that is less than layers further from the substrate. Each of the seven layers can have a layer thickness that is between about twenty five (25) and about fifty (50) nanometers. The film can have a total thickness that is between about 175 nanometers about 350 nanometers. Peak absorption of the film can be between about 220 nanometers and about 280 nanometers.

In an aspect, a UV photodetector includes a substrate, a film deposited on the substrate, and an electrode coupled to the substrate and connected electrically to the film. The film includes a first layer deposited over the substrate having a composition according to $Mg_{0.80}Zn_{0.20}O$, a second layer deposited over the first layer having a composition according to $Mg_{0.75}Zn_{0.25}O$, and a third layer deposited over the second layer having a composition according to $Mg_{0.70}Zn_{0.30}O$. The film also includes a fourth layer deposited over the third layer having a composition according to $Mg_{0.65}Zn_{0.35}O$, a fifth layer deposited over the fourth layer having a composition according to $Mg_{0.60}Zn_{0.40}O$, a sixth layer deposited over the fifth layer having a composition according to $Mg_{0.55}Zn_{0.45}O$, and a seventh layer deposited over the sixth layer having a composition according to $Mg_{0.50}Zn_{0.50}O$. An electrode is coupled to the substrate and is electrically connected to the film. The composition of the $Mg_xZn_{(1-x)}O$ forming a given layer can be uniform throughout the respective layer.

In another aspect, a method of making a UV photodetector as described above includes applying a first solution to a substrate using a spin coating technique, pyrolyzing the first solution coating to form a magnesium-zinc oxide layer, applying a second solution coating over the magnesium-zinc oxide layer using a spin coating technique, and pyrolyzing the second solution such that the crystalline structure of the first magnesium-zinc oxide layer influence the crystalline structure developed in the second magnesium-zinc oxide layer during pyrolization. The first solution includes magnesium and zinc in solution according to $Mg_x$ and $Zn_{(1-x)}$, the second solution coating includes magnesium and zinc in solution according to $Mg_yZn_{(1-y)}$ where X is greater than Y. Optionally, the pyrolyzed layers can be calcined to further define crystalline structures therein. An electrode can be deposited over the incident layer that is coupled to the substrate by the film and is connected electrically to the film.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
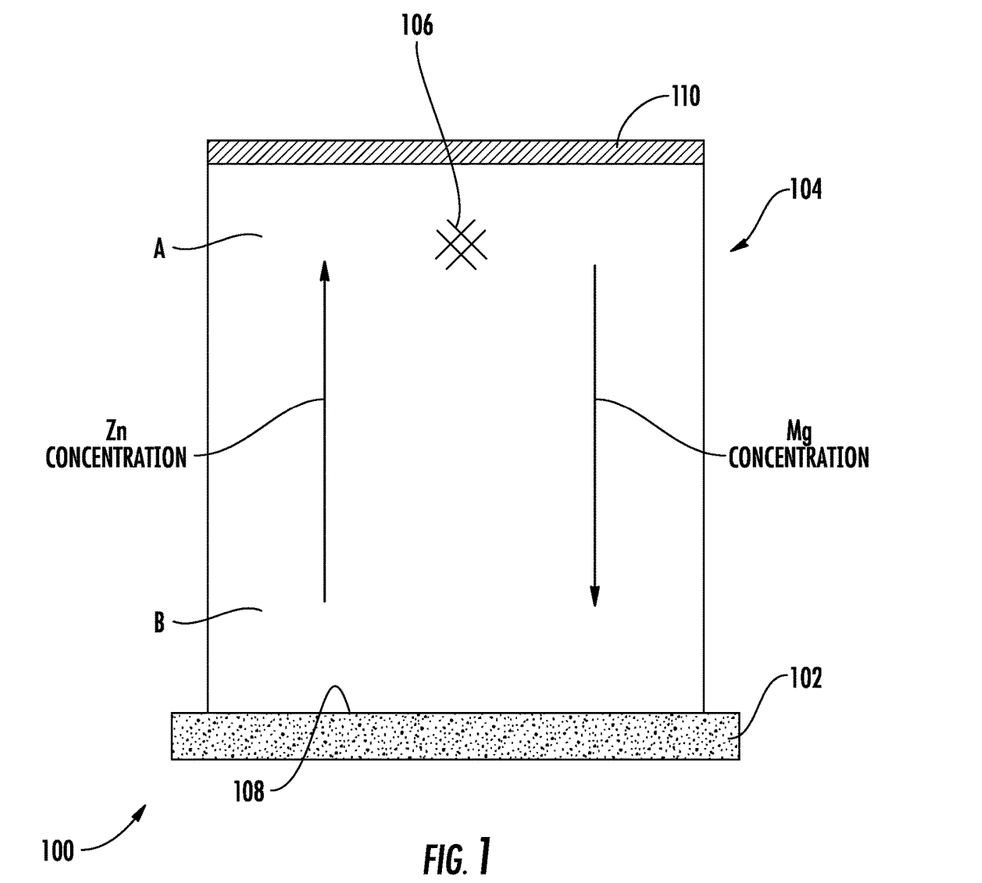
FIG. 1 is a schematic side elevation view of an exemplary embodiment of an ultraviolet (UV) photodetector constructed in accordance with the present disclosure, showing a compositionally grade magnesium-zinc oxide film.

Reference will now be made to the drawings wherein like reference numerals identify similar structural features or aspects of the subject disclosure. For purposes of explanation and illustration, and not limitation, a partial view of an exemplary embodiment of an ultraviolet (UV) photodetector in accordance with the disclosure is shown in FIG. 1 and is designated generally by reference character 100. Other embodiments of UV photodetectors and methods of making UV photodetectors in accordance with the disclosure, or aspects thereof, are provided in FIGS. 2-4, as will be described. The systems and methods described herein can be used for making UV sensors for flame detectors, such as for residential and/or industrial applications.

Referring now to FIG. 1 UV photodetector 100 is shown. UV photodetector 100 includes a film 104 deposited over a substrate 102 and an electrode 110. Electrode 110 is coupled to substrate 102 by film 104 and is connected electrically to film 104. Electrode 110 may include one or more electrode structures separated by one another by a gap (not shown for clarity reasons) that facilitates UV radiation received by the photodetector to contact film 104.

Film 104 includes a magnesium-zinc oxide composition 106 that is compositionally graded such that zinc content in the film increases with distance from a surface 108 of substrate 102. As indicated with the arrow appearing on the right-hand side of FIG. 1, magnesium content in film 104 decreases with distance from substrate surface 108 and toward electrode 110 from a film lower portion A to a film upper portion B. As indicated with the arrow appearing on the left-hand side of FIG. 1, zinc content increases within film 104 with distance from substrate surface 108 and toward electrode 110 from film lower portion A to film upper portion B. It is contemplated that compositional grading through film 104 is such that the peak absorption of the film is red-shifted, i.e. shifted toward the visible portion of the electromagnetic spectrum, relative to magnesium-zinc oxide layers having a composition according to $Mg_{0.8}Zn_{0.2}O$. Red-shifting film 104 compensates for the magnitude of the blue-shift associated certain types magnesium-zinc oxide films that can cause such films to have peak absorptions at wavelengths unsuitable for some applications.

Figure 2:
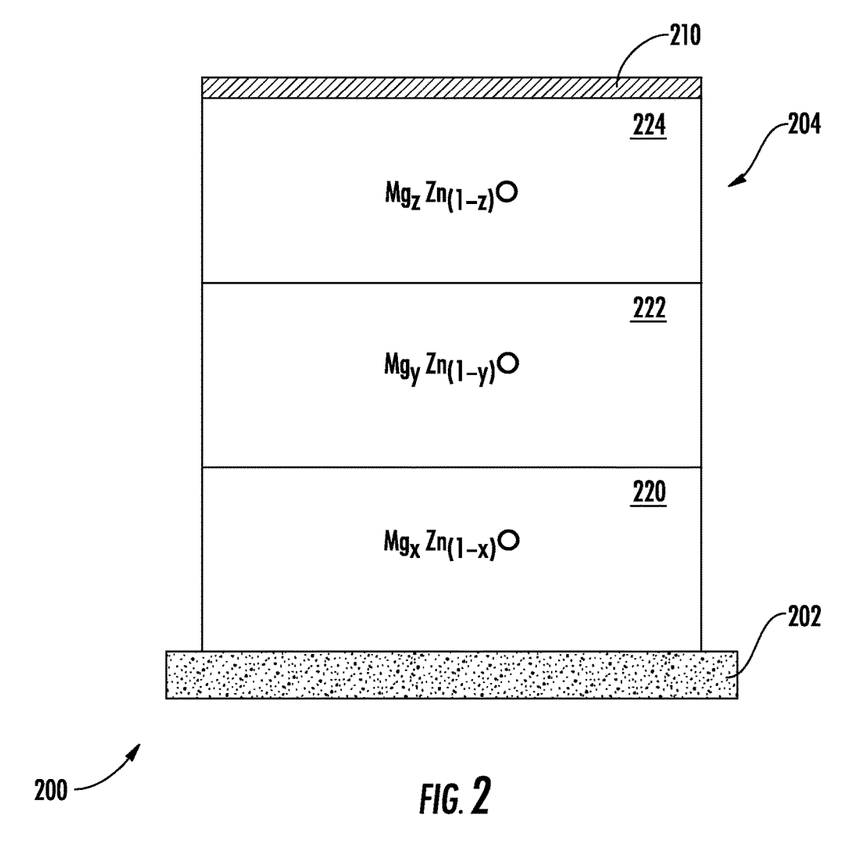
FIG. 2 is a schematic side elevation view of the UV photodetector of FIG. 1, showing a compositionally graded magnesium-zinc oxide film having layers with different magnesium-to-zinc ratios.

With reference to FIG. 2, a photodetector 200 is shown. Photodetector 200 is similar to the photodetector 100 and additionally includes a film 204 having plurality of layers deposited over a substrate 202. In this respect film 204 includes a base layer 220 overlaying substrate 202, one more intermediate layers 222 overlaying base layer 220, and an incident layer 224 overlaying the one or more intermediate layer 222. Each of base layer 220, intermediate layer 222, and incident layer 224 has a magnesium-zinc oxide composition that is different from the other layers.

Within each layer the ratio of magnesium-to-zinc within the magnesium-zinc oxide is homogenous. Between layers, the ratio of magnesium-to-zinc in the magnesium-zinc oxide composition forming the respective layers is different from the others. For example, in the illustrated exemplary embodiments, base layer 220 has a magnesium-zinc oxide composition according to the formula $Mg_xZn_{(1-x)}O$, intermediate layer 222 has a magnesium-zinc oxide composition according to the formula $Mg_yZn_{(1-y)}O$, and incident layer 224 has a magnesium-zinc oxide composition according to $Mg_zZn_{(1-z)}O$ where X is greater than Y and Y is greater than Z. In this respect layers closer to (i.e. proximate) substrate 202 have a greater ratio of magnesium-to-zinc than layers further from (i.e. distal) substrate 202.

Figure 3:
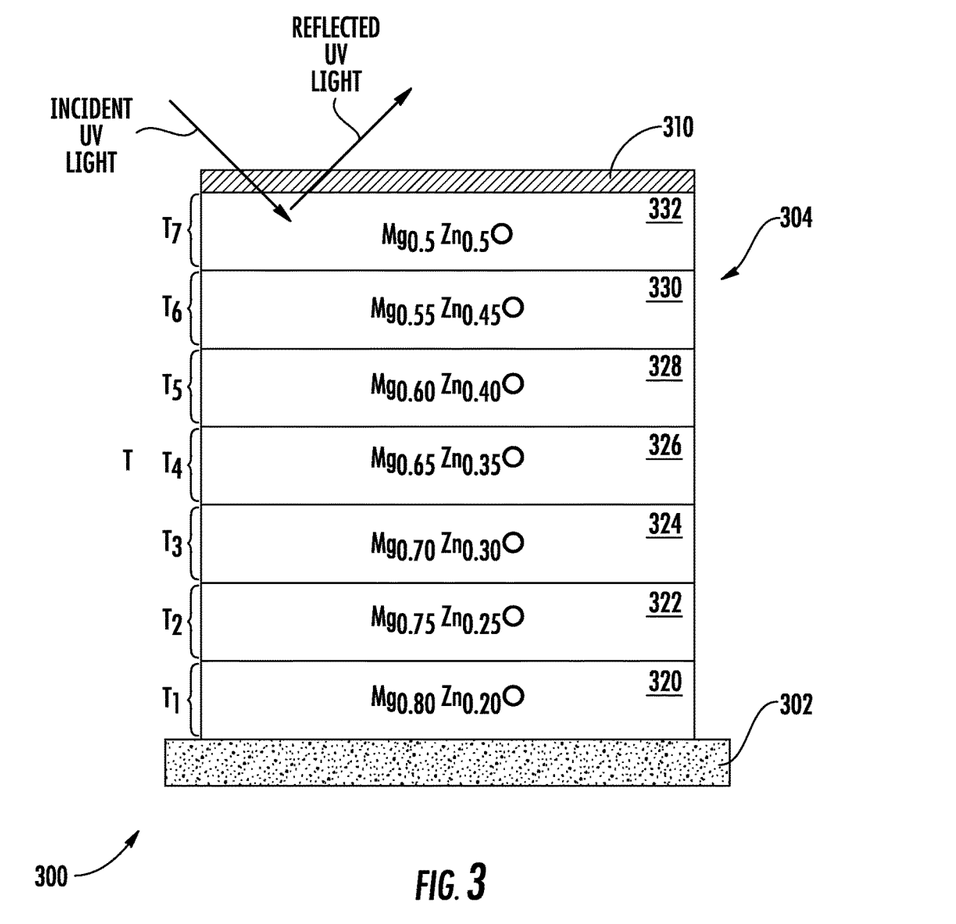
FIG. 3 is schematic side elevation view of an embodiment of a UV photodetector according to an embodiment, showing seven layers having seven magnesium-zinc oxide layers, each layer having a composition with a magnesium-to-zinc ratio that is different than the magnesium to zinc ratio of the other layers.

With reference to FIG. 3, a UV photodetector 300 is shown according to an exemplary embodiment. UV photodetector 300 is similar to photodetector 100 and additional includes a compositionally graded film 304. Film 304 has seven layers formed from seven distinct magnesium-zinc oxide compositions. UV photodetector 300 has a first layer 320 overlaying substrate 302, a second layer 322 overlaying first layer 320, and a third layer 324 overlaying second layer 322. UV photodetector 300 also includes a fourth layer 326 overlaying third layer 324, a fifth layer 328 overlaying fourth layer 326, a sixth layer 330 overlaying fifth layer 328, and a seventh layer 332 overlaying sixth layer 330. First layer 320 forms a base layer, seventh layer 332 forms an incident layer, and second through sixth layers 322-330 form a plurality of intermediate layers. Electrode 310 overlays incident layer 332 and film 304 generally, and is electrically connected to incident layer 332. Incident layer 332 has magnesium-zinc oxide composition according to $Mg_{0.5}Zn_{0.5}O$.

Each of the layers forming a respective layer of film 304 have a magnesium-to-zinc ratio that is different from that of the other layers. Starting from first layer 320, composition of the magnesium-zinc oxide layers changes in a stepwise manner upwards through film 304. Each succeeding layer has incrementally less magnesium and incrementally more zinc than the underlying layer. In the illustrated exemplary embodiment layer metal contents change stepwise in increments of about 0.05, i.e. by about 5%, relative to the preceding layer. This step size enables the film to start with a base layer 320 having composition that pyrolyzes with cubic crystalline structure adjacent substrate 302 and which may have a UV absorption that is less than ideal for certain applications, and end with an incident layer 332 that both has a cubic crystalline structure and which has a UV absorption more suitable than the base layer for the intended application. This intermediate layers, i.e. layers 322-330, transfer the cubic crystalline structure upwards (relative to the substrate) through the film stack as the magnesium to zinc ratio is adjusted. As will be appreciated, the increment size between layers can be larger or smaller, as suitable for an intended application. As will also be appreciated, the composition of the incident can be more or less than a 1 to 1 ratio of magnesium to zinc. As will further be appreciated, there can be fewer or more intermediate layers in the film stack.

In the illustrated exemplary embodiment, first layer 320 has a magnesium-zinc oxide composition according to $Mg_{0.80}Zn_{0.20}O$, second layer 322 has a magnesium-zinc oxide composition according to $Mg_{0.75}Zn_{0.25}O$, and third layer 324 has a magnesium-zinc oxide composition according to $Mg_{0.70}Zn_{0.30}O$. Fourth layer 326 has a magnesium-zinc oxide composition according to $Mg_{0.65}Zn_{0.35}O$, fifth layer 328 has a magnesium-zinc oxide composition according to $Mg_{60}Zn_{0.40}O$, sixth layer 330 has a magnesium-zinc oxide composition according to $Mg_{0.55}Zn_{0.45}O$, and seventh layer 332 has a magnesium-zinc oxide according to $Mg_{0.50}Zn_{0.50}O$.

The exemplary compositional gradient illustrated in FIG. 3 (a) employs a spin coating and pyrolyzing deposition process that is optimized for magnesium-zinc oxide layers with $Mg_{0.80}Zn_{0.20}O$ composition, (b) provides a peak absorption in the range of 220-280 nanometers, and (c) provides a cubic structure throughout film 304 that is solar blind. As will be appreciated, peak absorption in the range of 220 and 280 nanometers provides sensitivity to UV radiation emitted by flame. Moreover, since of the layers forming film 304, i.e. first layer 320 through seventh layer 332, have a thickness $T_x$ that is each about fifty (50) nanometers, film 304 has a thickness that is about 350 nanometers. As will be appreciated by those skilled in the art in view of the present disclosure, other step increments, base layer compositions, thicknesses, and incident layer compositions are possible within the scope of the present disclosure. Other film thicknesses and layer thicknesses are also contemplated.

Figure 4:
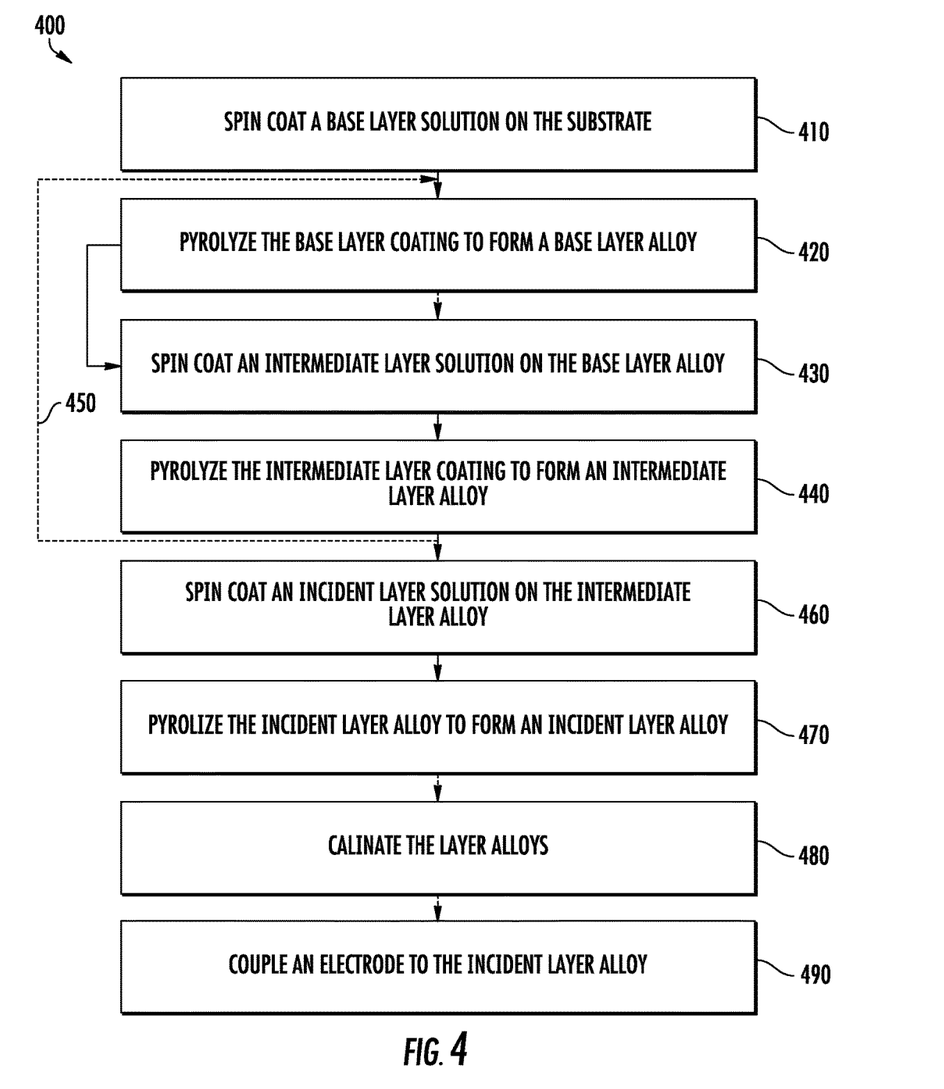
FIG. 4 is a method of making a compositionally graded UV photodetector using solutions that have different ratios of magnesium to zinc therein.

With reference to FIG. 4, a method 400 of making a UV photodetector is shown. Method 400 includes spin coating a first solution having a first magnesium-to-zinc ratio over a substrate, as indicated with box 410. This forms a base coating with a magnesium-to-zinc ratio corresponding the magnesium-to-zinc ratio of the first solution. The base coating then is pyrolyzed to form a base layer, e.g. base layer 204 (shown in FIG. 2), having a cubic crystalline structure as shown with box 420. The resulting base layer has magnesium rich composition, e.g. a composition according to about $Mg_{0.79}Zn_{0.21}O$ or $Mg_{0.80}Zn_{0.20}O$.

A second solution having a second magnesium-to-zinc ratio is spin coated over the base layer, as shown with box 430. The second solution is less magnesium rich than the first solution, and has a magnesium-to-zinc ratio that is less than that of the first solution. This forms an intermediate coating with a magnesium-to-zinc ratio corresponding to the magnesium-to-zinc ratio of the second solution. The intermediate coating is then pyrolyzed to form an intermediate layer, e.g. intermediate layer 222 (shown in FIG. 2), having a cubic crystalline structure as shown with box 440. This process continues with successive coatings formed with lower ratios of magnesium-to-zinc, e.g. in increments of about x=0.05 or other suitable increment size, to carry the cubic phase of the underlying layer into the succeeding overlaying layer, until a desired incident layer, e.g. incident layer 224 (shown in FIG. 2), is realized, as shown with box 450. If the intermediate layer is not sufficiently close to the desired ratio of the incident layer, e.g. respective ratios of magnesium and zinc are each within 5% of a one-to-one ratio, then operations 430 and 440 are repeating using a solution with a greater zinc to magnesium concentration.

Otherwise an incident solution is spin coated over the preceding intermediate layer, as shown with box 460, and calcined, as shown with box 470. This forms an incident layer with a magnesium-to-zinc ratio of about 0.5 to 0.5 and which has a crystalline structure corresponding to that of the base layer, i.e. substantially cubic.

As used herein, pyrolysis means heating the coating to a predetermined temperature such that substantially all the organic ligands and solvents are driven off and/or oxidized (burned off), but not so much that the crystalline structure within the layer fully develops. This allows a layer subsequently deposited on the layer to both chemically bond with the layer and be influenced structurally by the crystalline structure of the pyrolyzed layer. Hence, the cubic structure not that the composition of the incident layer ordinarily precludes is transferred into the layer through the intervening layers from the base layer, which has a composition amenable to developing a cubic structure.

Optionally, the film stack may be calcined, as shown with box 480. Calcining may be done once the incident layer has been deposited over the one or more intervening layers, as shown with box 482. Calcining can be done at a predetermined calcination temperature that, as shown with box 484, may be higher than one or more of the predetermined pyrolysis temperatures used with the base layer and/or intermediate layer(s). Whether or not the optional calcining is done can be based on a determination of film stack performance subsequent to pyrolyzing the spin coated solution.

Magnesium-zinc oxide layers with compositions according to $Mg_xZn_{(1-x)}O$ can be formed by coating substrates with a magnesium and zinc solution and pyrolyzing the coating formed by the solution. This process can produce magnesium-zinc oxide film that has cubic crystalline structure and has a thickness that is on the order of about 350 nanometers. While generally satisfactory for their intended purpose, such materials can have a peak absorption of about 185 nanometers—which may require shifting in order for the magnesium-zinc oxide layer to benefit certain types of UV photodetectors like residential flame detectors, where peak absorptions of between 220 and 280 nanometers can be beneficial.

One approach to shifting the peak absorption of the magnesium-zinc oxide layer is to shift the magnesium-to-zinc ratio layer to a ratio range between $Mg_{0.36}Zn_{0.64}O$ and $Mg_{0.62}Zn_{0.38}O$, i.e. from x=0.36 to 0.62. However, magnesium-zinc oxide layers formed using conventional spin coat techniques with magnesium-to-zinc ratios may not yield a cubic crystalline structure, potentially reducing the solar blindness of magnesium-zinc layer.

In embodiments described herein, photodetectors include compositionally graded layers of magnesium-zinc oxide compositions. The initial layer has a cubic crystalline structure that renders the layer solar blind and which may have a peak absorption wavelength too short for some types of flame detection. Intervening layers have magnesium-to-zinc ratios that decrease progressively, red shifting the peak absorption of the film stack to a wavelength suitable for flame detection, and have cubic crystalline structures owing to the influence of the crystalline structure of their respective underlying layer, thereby also being solar blind. As a result, the incident layer of the film stack has improved solar blindness due to the cubic crystalline microstructure of the layer and has a peak absorption wavelength suitable for flame detection due to the magnesium to zinc ratio of the magnesium-zinc oxide composition forming the layer.

In certain embodiments, seven layers are deposited on a substrate by successively spin coating and pyrolyzing magnesium and zinc solution with different magnesium and zinc ratios. These different magnesium and zinc ratios pyrolyze as magnesium-zinc oxide compositions with ratios of zinc to magnesium that increase, layer wise, upwards (relative to the substrate) in the layer stack. Respective layers can have substantially the same thicknesses, e.g. about fifty (50), though different thicknesses are also contemplated. It is contemplated that the film have seven layers, each with a layer thickness of about fifty (50) nanometers, and that the film formed by the seven have a film thickness extending between the substrate and the top surface of the incident layer of about 350 nanometers.

From a first layer pyrolyzed having a magnesium-to-zinc ratio that readily pyrolyzes into a cubic crystalline structure, successive layers with magnesium-to-zinc less apt to develop cubic crystalline structures on conventional substrates are deposited on magnesium-zinc oxide layers with cubic crystalline structures. The cubic crystalline structure of the underlying magnesium-zinc oxide layer causes the overlaying layer to develop a cubic crystalline structure—succeeding layers developing cubic crystalline structures through association with the cubic crystalline structure of the underlying layer. This allows the incident layer in the film to have a peak absorption in the range of 220 to 280 nanometers and have a cubic crystalline structure.

The methods and systems of the present disclosure, as described above and shown in the drawings, provide for UV photodetectors and methods of making such photodetectors with superior properties including compositionally tuned magnesium-zinc oxide layer for red shifting the spectrum of incident radiation wavelength absorbed by the photodetectors. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An ultraviolet (UV) photodetector, comprising:
a substrate;
an electrode coupled to the substrate; and
a compositionally graded magnesium-zinc oxide film deposited on the substrate and connected to the electrode, wherein the film comprises:
a base layer with a $Mg_xZn_{(1-x)}O$ composition overlaying the substrate;
one or more intermediate layers with a $Mg_yZn_{(1-y)}O$ composition overlaying the base layer; and
an incident layer with a $Mg_zZn_{(1-z)}O$ composition overlaying the intermediate layer, wherein x is greater than y, and wherein y is greater than z, the film having a zinc content that increases from a portion of the film adjacent the substrate to a portion of the film opposite the substrate to red shift the peak absorption of the film.

2. The UV photodetector as recited in claim 1, wherein the film includes a plurality of layers deposited on the substrate, each succeeding layer having a zinc content that is greater than each preceding layers interposed between the succeeding layer and the substrate.

3. The UV photodetector as recited in claim 1, wherein the film includes a plurality of layers deposited on the substrate, each succeeding layer having a magnesium content that is less than each of the preceding layers interposed between the succeeding layer and the substrate.

4. The UV photodetector as recited in claim 1, wherein the film comprises a plurality of layers having a cubic crystalline structure.

5. The UV photodetector as recited in claim 1, wherein the film has a thickness of between about 175 nanometers and about 350 nanometers.

6. The UV photodetector as recited in claim 1, wherein the film comprises a plurality of layers each having a thickness of between about twenty-five (25) nanometers and about fifty (50) nanometers.

7. The UV photodetector as recited in claim 1, wherein the film includes a base layer having magnesium-zinc oxide composition according to about $Mg_{0.80}Zn_{0.20}O$.

8. The UV photodetector as recited in claim 1, wherein the film includes an incident layer having a magnesium-zinc oxide composition with a magnesium to zinc ratio that is between 0.5 to 0.5 and 0.65 to 0.35.

9. The UV photodetector as recited in claim 1, wherein the film includes at least one intermediate layer overlaying the base layer and having less magnesium than the base layer.

10. The UV photodetector as recited in claim 1, wherein the film comprises seven layers overlaying the substrate, wherein magnesium content decreases stepwise from a first layer adjacent the substrate through the seventh layer.

11. The UV photodetector as recited in claim 1, wherein the film has a peak absorption that is between about 220 nanometers and about 280 nanometers.

12. An ultraviolet (UV) photodetector, comprising:
a substrate;
an electrode coupled to the substrate; and
a compositionally graded magnesium-zinc oxide film deposited on the substrate and connected to the electrode,
wherein the film comprises three or more layers overlaying the substrate and zinc content increases stepwise from a first layer adjacent the substrate through an incident layer, and
wherein the film has a zinc content that increases from a portion of the film adjacent the substrate to a portion of the film opposite the substrate to red shift the peak absorption of the film.

13. The UV photodetector as recited in claim 12, wherein each of the three or more layers have a zinc content that is greater than each preceding layers interposed between the succeeding layer and the substrate.

14. The UV photodetector as recited in claim 12, wherein each of the three or more layers has a magnesium content that is less than each of the preceding layers interposed between the succeeding layer and the substrate.

15. The UV photodetector as recited in claim 12, wherein each of the three or more layers has a cubic crystalline structure.

16. The UV photodetector as recited in claim 12, wherein the film has a thickness of between about 175 nanometers and about 350 nanometers.

17. The UV photodetector as recited in claim 12, wherein each of the three or more layers has a thickness of between about twenty-five (25) nanometers and about fifty (50) nanometers.

18. The UV photodetector as recited in claim 12, wherein the film includes a base layer having magnesium-zinc oxide composition according to about $Mg_{0.80}Zn_{0.20}O$.

19. The UV photodetector as recited in claim 12, wherein the film includes an incident layer having a magnesium-zinc oxide composition with a magnesium to zinc ratio that is between 0.5 to 0.5 and 0.65 to 0.35.

20. The UV photodetector as recited in claim 12, wherein the film includes at least one intermediate layer overlaying the base layer and having less magnesium than the base layer.

21. The UV photodetector as recited in claim 12, wherein the film comprises seven layers overlaying the substrate, wherein magnesium content decreases stepwise from a first layer adjacent the substrate through the seventh layer.

22. The UV photodetector as recited in claim 12, wherein the film has a peak absorption that is between about 220 nanometers and about 280 nanometers.

\* \* \* \* \*